(12) United States Patent
Sandoval et al.

(10) Patent No.: US 10,170,911 B1
(45) Date of Patent: Jan. 1, 2019

(54) PROVIDING PHASE SYNCHRONIZATION AND HARMONIC HARVESTING

(71) Applicant: Veritone Alpha, Inc., Costa Mesa, CA (US)

(72) Inventors: Michael Luis Sandoval, Bellevue, WA (US); Wolf Kohn, Seattle, WA (US); Jonathan Cross, Bellevue, WA (US)

(73) Assignee: Veritone Alpha, Inc., Costa Mesa, CA (US)

( * ) Notice: Subject to any disclaimer, the term of this patent is extended or adjusted under 35 U.S.C. 154(b) by 0 days.

(21) Appl. No.: 15/793,818

(22) Filed: Oct. 25, 2017

Related U.S. Application Data

(60) Provisional application No. 62/379,670, filed on Aug. 25, 2016.

(51) Int. Cl.
| | | |
|---|---|---|
| H02J 3/01 | (2006.01) | |
| H02M 1/12 | (2006.01) | |
| G05F 1/70 | (2006.01) | |
| H03L 7/08 | (2006.01) | |
| H02M 1/00 | (2006.01) | |

(52) U.S. Cl.
CPC ............. H02J 3/01 (2013.01); G05F 1/70 (2013.01); H02M 1/12 (2013.01); H03L 7/08 (2013.01); *H02M 2001/0083* (2013.01)

(58) Field of Classification Search
CPC .. H02M 1/12; H02M 5/18; H02M 2001/0083; H02J 3/01; G05F 1/70
See application file for complete search history.

(56) References Cited

U.S. PATENT DOCUMENTS

| | | | | |
|---|---|---|---|---|
| 3,927,280 A | * | 12/1975 | Gupta ................. | H04B 3/16 333/216 |
| 4,274,134 A | * | 6/1981 | Johannessen ........... | H03K 3/57 307/106 |
| 4,891,536 A | * | 1/1990 | Fox ................... | H03K 17/6874 327/427 |
| 4,964,027 A | * | 10/1990 | Cook .................. | H02M 1/12 363/40 |
| 5,047,909 A | * | 9/1991 | Hosoda ................ | H02M 1/12 318/806 |
| 5,343,139 A | * | 8/1994 | Gyugyi ................ | G05F 5/00 174/DIG. 17 |
| 5,345,375 A | * | 9/1994 | Mohan ................. | H02J 3/01 307/105 |
| 5,406,471 A | * | 4/1995 | Yamanaka ............ | H02M 1/4225 323/222 |

(Continued)

OTHER PUBLICATIONS

Uddin, K., et al., "The effects of high frequency current ripple on electric vehicle battery performance," Applied Energy 178, Apr. 8, 2016, 13 pages.

*Primary Examiner* — Yusef A Ahmed
(74) *Attorney, Agent, or Firm* — VLP Law Group LLP; James A. D. White

(57) ABSTRACT

Techniques are described for reducing or dampening harmonics in a power signal to be supplied to a power system. The techniques may also be used to synchronize the power signal to be supplied to the power system with the power that is currently present on the power system. The techniques operate to step down the signals to be processed, process the signals using low-current op amps, and then step the signals back up to be transmitted on a high current system. The values of the circuit components may be determined by using a solution for an accompanying transfer function.

17 Claims, 3 Drawing Sheets

(56) References Cited

U.S. PATENT DOCUMENTS

| | | | | |
|---|---|---|---|---|
| 5,636,106 A * | 6/1997 | Batarseh | H02M 1/4208 | 323/222 |
| 6,295,216 B1 * | 9/2001 | Faria | H02M 1/12 | 307/105 |
| 6,882,550 B1 * | 4/2005 | Baumgart | H02M 1/12 | 323/207 |
| 9,306,444 B2 * | 4/2016 | Kapinski | H02M 5/27 | |
| 9,692,320 B2 * | 6/2017 | Mascioli | H02M 7/537 | |
| 9,748,844 B2 * | 8/2017 | Ramabhadran | H02M 3/1582 | |
| 2002/0149953 A1 * | 10/2002 | Smedley | H02J 3/01 | 363/84 |
| 2006/0229767 A1 * | 10/2006 | Chu | H02J 3/00 | 700/286 |
| 2007/0086134 A1 * | 4/2007 | Zweigle | G01R 19/2513 | 361/85 |
| 2009/0182518 A1 * | 7/2009 | Chu | H02J 3/06 | 702/61 |
| 2009/0206763 A1 * | 8/2009 | Shannon | H05B 41/2827 | 315/224 |
| 2010/0290258 A1 * | 11/2010 | Sullivan | H02M 1/12 | 363/71 |
| 2012/0069606 A1 * | 3/2012 | Sagneri | H02M 3/158 | 363/21.02 |
| 2013/0229839 A1 * | 9/2013 | Escobar | H02M 1/12 | 363/40 |
| 2015/0115905 A1 * | 4/2015 | Hui | H02J 3/1814 | 323/207 |
| 2015/0349629 A1 * | 12/2015 | Wu | H02M 1/00 | 323/205 |
| 2015/0381187 A1 * | 12/2015 | Ahmed | H02J 3/01 | 327/156 |
| 2017/0117748 A1 * | 4/2017 | Mondal | H02J 9/061 | |

* cited by examiner

PROVIDING PHASE SYNCHRONIZATION AND HARMONIC HARVESTING

CROSS-REFERENCE TO RELATED APPLICATIONS

This application claims the benefit of U.S. Provisional Patent Application No. 62/379,670, filed Aug. 25, 2016 and entitled "System And Method For Providing Phase Synchronization And Harmonic Harvesting," which is hereby incorporated by reference in its entirety.

TECHNICAL FIELD

The present disclosure pertains generally to providing phase synchronization and reducing harmonics when coupling a power source to a system, such as for systems and methods for providing phase synchronization and reducing harmonics when connecting non-linear power sources to a utility system.

BACKGROUND

Utility companies have made various attempts to control the parameters of power being input into their utility systems by synchronizing this input power with the characteristics of the power already on the utility system. The ability to synchronize incoming power may become increasingly important as utility companies accept power from non-linear systems, such as rooftop solar arrays or batteries located at the edge of the utility system.

When DC (direct current) power is converted to AC (alternating current) power and transmitted to the utility system, the conversion process may introduce harmonics into the resulting AC power signal. In some instances, the power associated with these harmonics may represent up to 50% or more of the total power to be delivered to the utility system, but the power associated with the harmonics cannot be used by the utility. In addition, introducing harmonics into the utility system may damage components within the utility system.

Utility companies have attempted to implement various techniques to prevent harmonics from entering the utility system. One of those techniques involves filtering the power being delivered to the system to remove the harmonic signals. Utility companies have traditionally used switches to implement filters because the switches can handle the high energy and high current present on a utility system. Filtering using switches, though, has drawbacks. For example, filters built from switches do not closely match the frequencies of certain harmonics, such as the third and the fifth harmonics, and thus provide only a limited capability for removing these harmonics from the signal. In addition, switches may introduce new harmonics into the signal. In some situations, a switch-based filter may introduce the seventh harmonic into the signal even as it attempts to filter the third and the fifth harmonics. Furthermore, switches used by power utility companies are expensive, thus further detracting from their widespread use by utility companies.

DETAILED DESCRIPTION

Figure 1:
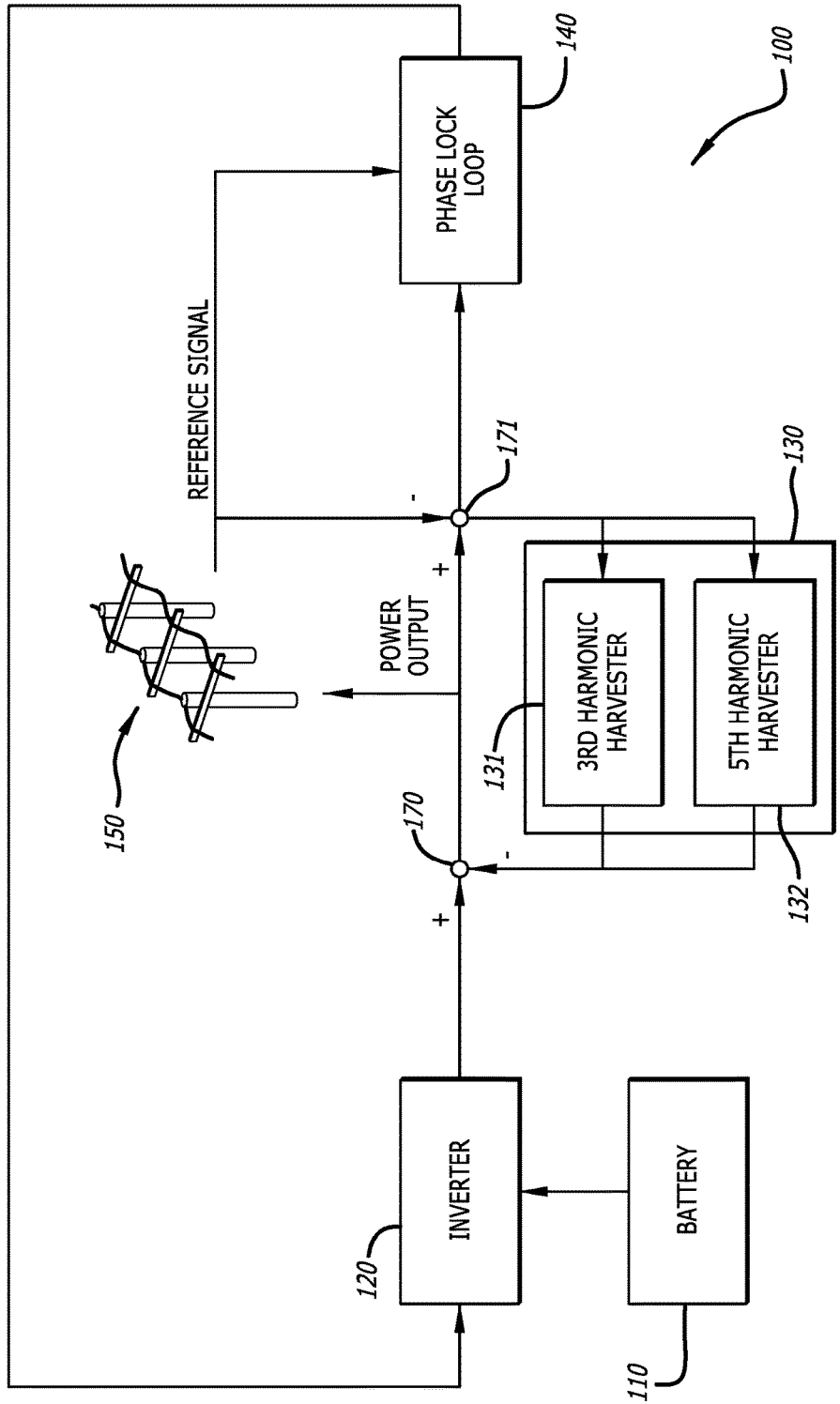
FIG. 1 illustrates an implementation of a synchronizer that filters one or more harmonics contained in a power signal.

The features and teachings disclosed herein can be utilized separately or in conjunction with other features and teachings to provide a system and method for synchronizing phase and damping harmonics of signals coming from power sources. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed above in the detailed description may not be necessary to practice the teachings in the broadest sense, and are instead taught merely to describe particularly representative examples of the present teachings.

Systems and methods are disclosed that reduce one or more harmonics in a first signal. In at least some instances, the systems and methods include a step-down converter that uses the first signal to generate a second signal with a second current that is less than the first current; a harmonic harvester system that includes one or more harmonic harvesters, each harmonic harvester configured to use one or more op amps to produce a damping signal (also referred to herein as a "dampening" signal) that at least reduces one harmonic in the first signal, wherein the harmonic harvester system combines each damping signal produced by each harmonic harvester into a third signal having a third current; and a step-up converter that uses the third signal to generate fourth signal with a fourth current that is less than the third current.

In some implementations, one or more of the damping signals reduce or damp at least one of the harmonics present in the first signal. In some implementations, the systems and methods further comprise a battery and an inverter, wherein the inverter is used to generate the first signal. In some implementations, at least one of the harmonic harvesters uses components that satisfies a second order differential equation with the following transfer function:

$$\frac{Y(s)}{u(s)} = \frac{ks}{s^2 + 2\xi\omega s + \omega^2}$$

wherein (i) $\omega$ represents a harmonic to be reduced by the at least one harmonic harvester, (ii) a value for k is chosen based on a voltage of the harmonic to be reduced, and (iii) a value for $\xi$ is chosen to substantially prevent overshoot of the damping signal produced by the at least one harmonic harvester.

In some implementations, the systems and methods are used to provide an output power signal to a power utility system. The systems and methods may further use a phase lock loop to synchronize the fourth signal with a reference signal present on the power utility system.

A system for reducing one or more harmonics in a high current signal may be summarized as including: a step-down converter that uses the high current input signal to generate a low current input signal, wherein the current of the low current input signal is less than the current of the high current input signal; a harmonic harvester system that includes one or more harmonic harvesters, each harmonic harvester configured to use one or more op amps to produce a damping signal that at least reduces one harmonic in the high current input signal, wherein the harmonic harvester system combines each damping signal produced by each harmonic harvester into a low current filtering signal; and a step-up converter that uses the low current filtering signal to generate high current filtering signal, wherein a current of the low current filtering signal is less than the a current of the high current filtering signal.

The harmonics reduced by the damping signal may include the third harmonic and the fifth harmonic. At least one of the damping signals may be used to reduce or damp at least one of the harmonics in the high current input signal.

The system for reducing one or more harmonics in a high current signal may further include a battery and an inverter, wherein the inverter generates the high current input signal.

At least one harmonic harvester uses components that satisfy a second-order differential equation with a transfer function given by:

$$\frac{Y(s)}{u(s)} = \frac{ks}{s^2 + 2\xi\omega s + \omega^2}$$

wherein $\omega$ represents a harmonic to be reduced by the at least one harmonic harvester, wherein a value for k is chosen based on a voltage of the harmonic to be reduced, and wherein a value for $\xi$ is chosen to substantially prevent overshoot of the low current damping signal produced by the at least one harmonic harvester.

The system for reducing one or more harmonics in a high current signal may further include a component that combines the input high current signal with the high current filtering signal to produce a clean high current signal, the clean high current signal being delivered to a power utility system.

The system for reducing one or more harmonics in a high current signal may further include a phase lock loop that synchronizes the high current filtering signal to a reference signal received from the power utility system.

A method for reducing one or more harmonics in a first signal, the first signal having a first current, may be summarized as including: stepping-down the first signal to generate a second signal, wherein the second signal has a second current that is less than the first current; providing a harmonic harvester system that includes one or more harmonic harvesters, each harmonic harvester configured to use one or more op amps; producing a damping signal from each harmonic harvester, using one or more op amps of each harmonic harvester, that at least reduces one harmonic in the first signal; combining, using the harmonic harvester system, each damping signal produced by each harmonic harvester into a third signal having a third current; stepping-up the third signal to generate fourth signal, wherein the fourth signal has a fourth current that is greater than the third current; and damping the one or more harmonics in the first signal by combining the first signal and the fourth signal.

The harmonics reduced by the damping signal may include the third harmonic and the fifth harmonic. At least one of the damping signals may be used to reduce or damp at least one of the harmonics in the first signal.

The method for reducing one or more harmonics in a first signal, the first signal having a first current, may further include generating the first signal using a battery and an inverter.

At least one harmonic harvester may use components that satisfy a second-order differential equation with a transfer function given by:

$$\frac{Y(s)}{u(s)} = \frac{ks}{s^2 + 2\xi\omega s + \omega^2}$$

wherein $\omega$ represents a harmonic to be reduced by the at least one harmonic harvester, wherein a value for k is chosen based on a voltage of the harmonic to be reduced, and wherein a value for $\xi$ is chosen to substantially prevent overshoot of the damping signal produced by the at least one harmonic harvester.

The method for reducing one or more harmonics in a first signal, the first signal having a first current, may further include synchronizing the fourth signal to a reference signal received from the power utility system.

For illustrative purposes, some embodiments are described below in which specific types of operations are performed and/or specific types of hardware elements are used. However, these examples are provided for illustrative purposes and are simplified for the sake of brevity, and the inventive techniques may be used in a wide variety of other situations, such that the invention is not limited to the techniques discussed for particular implementations. In addition, specific nomenclature is set forth in the description below to provide, for purposes of explanation only, a thorough understanding of the present systems and methods—however, it will be apparent to one skilled in the art that these specific details are not required to practice the teachings of the present system and method. Furthermore, some portions of the detailed descriptions herein are presented in terms of symbolic representations of operations and associated descriptions, such as to employ means used by those skilled in the arts to effectively convey the substance of the work, but many or all such operations may perform physical manipulations of physical quantities (e.g., electrical or magnetic signals capable of being stored, transferred, combined, compared, and otherwise manipulated, such as may be referred to at times as bits, values, elements, symbols, characters, terms, numbers, or the like), and these and similar terms may merely represent convenient labels applied to the appropriate physical quantities. Unless specifically stated otherwise as apparent from the below discussion, it is appreciated that throughout the description, discussions utilizing terms such as "processing," "computing," "calculating," "determining," "displaying," "configuring," or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices. Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The disclosed systems and methods are directed towards synchronizing the phase and filtering harmonics for power signals that are introduced to a power system. FIG. 1 illustrates an embodiment of a synchronizer that filters the third harmonic and the fifth harmonic contained in a power signal. A synchronizer 100 includes a battery 110, an inverter 120, a harmonic harvester system 130, and a phase lock loop 140. The synchronizer 100 may function to synchronize the power generated by the battery 110 with the power present on a utility system 150. The synchronizer 100 may also function to filter the power signal delivered by the battery 110 through the inverter 120 to remove or damp one or more harmonics. For example, the harmonic harvester system 130 may include one or more components targeted towards a specific harmonic. For example, the harmonic harvester system 130 shown in FIG. 1 includes a third harmonic harvester 131 that damps or reduces the third harmonic, and a fifth harmonic harvester 132 that damps or reduces the fifth harmonic present in the power signal delivered by the inverter 120. These harmonics may be generated, for example, when the inverter 120 converts direct current power generated by the battery 110 to alternating current power signal to be delivered to the utility system 150. The power signal on the utility system 150 may include high current signals, for example, having currents ranging from 250 A to 1000 kA. The harmonic harvester system 130 may be modified to include additional harvesters to damp other harmonics present in the power signal generated by the inverter 120. For example, the harmonic harvester system 130 may further include a harvester targeted towards damping or reducing the seventh harmonic of the inverter's power signal.

In the embodiment shown in FIG. 1, the battery 110 may generate a DC power signal. This DC power signal may be generated, for example, by discharging a battery or as the output of a solar cell array. The battery 110 transmits the DC power to the inverter 120, which converts the DC power to an AC power signal. The inverter 120 may convert the DC power to an AC power signal having the same frequency as the power present on the utility system 150. When this conversion occurs, though, the inverter 120 may also generate one or more harmonics that become part of the output AC power signal. A harmonic in this example may be signal with a frequency that is a multiple of the power signal present on the utility system 150. The utility system 150 may not be able to use the power associated with the harmonics generated by the inverter 120. In some implementations, the inverter 120 may attempt to synchronize the phase of its output AC power signal with the phase of the power present on the utility system 150. To synchronize the phases, the inverter 120 may use the output from the phase lock loop 140. The inverter 120 transmits the synchronized output power signal to a node 170.

Node 170 accepts the AC power signal output by the inverter 120 along with a signal generated by the harmonic harvester system 130. As shown in FIG. 1, the signal generated by the harmonic harvester system 130 may include signals used to damp one or more harmonics present in the AC power signal transmitted by the inverter 120. For example, as shown in FIG. 1, the harmonic harvester system 130 may include signals generated by the third harmonic harvester 131 and the fifth harmonic harvester 132. The signals from each harmonic harvester may be used to damp a targeted harmonic present in the signal output by the inverter 120.

In some embodiments, the harmonic harvester system 130 may be configured to include more or fewer harmonic harvesters than those shown in FIG. 1. For example, the harmonic harvester system 130 may be configured to include a seventh harmonic harvester that generates a signal to damp or remove the seventh harmonic from the AC power signal transmitted by the inverter 120. In some embodiments, the harmonic harvester system 130 may be configured to generate signals to damp different harmonics, or a different combination of harmonics, than those shown in FIG. 1. As shown in FIG. 1, node 170 subtracts the signals generated by the harmonic harvester system 130 from the AC power signal generated by the inverter 120, thus reducing or damping those harmonics targeted by the harmonic harvesters that are present in the inverter's AC power signal. This modified signal in which one or more harmonics have been damped is then output to the utility system 150. The modified signal is also transmitted to a node 171 to be used for further processing by the synchronizer 100.

Node 171 accepts the modified power signal from node 170 and a reference power signal generated by the utility system 150. Node 171 may subtract the reference signal transmitted by the utility system 150 from the modified signal generated at node 170. The resulting signal generated at node 171 may be transmitted to the phase lock loop 140, which can use this signal to determine the phase difference, if any, between the power signal generated by the inverter 120 and the power signal present on the utility system 150. The output from the phase lock loop 140 may be transmitted to the inverter 120 to synchronize the phases of the power signal generated by the inverter 120 with the phase of the power present on the utility system 150. In some embodiments, the resulting signal generated at node 171 may be transmitted to the harmonic harvester system 130 for use in harvesting one or more harmonic signals.

Figure 2:
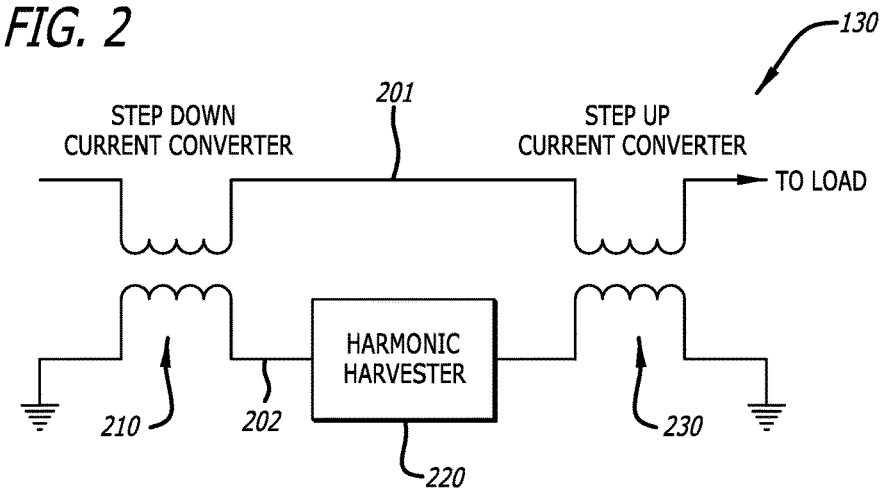
FIG. 2 illustrates an implementation of a harmonic harvesting component that operates in a low-current environment.

FIG. 2 illustrates an implementation of a harmonic harvesting component that operates in a low-current environment. As shown in FIG. 2, the harmonic harvester system 130 accepts a signal from a high current circuit 201 and steps this signal down for a low current circuit 202. The harmonic harvester system 130 may use a step down converter 210 to step the signal down to a current level that can be processed by one or more op amps (Operation Amplifiers). Op amps generally operate in a low current environment, for example, an environment in which the current is less than 1 Amp. The stepped down signal is then input to a harmonic harvester 220, which generates a signal that can be used to damp or reduce at least one harmonic present in the power signal generated by the inverter 120. The damping signal generated by the harmonic harvester 220 is then stepped up using a step up converter 230 before being transmitted on the high current circuit 201. The damping signal may be used to damp a harmonic present on the high current circuit 201.

Each component in the harmonic harvester system 130 may be represented by a transfer function that provides a relationship between the input and output signals. The transfer function may also be used to identify system components for each harmonic harvester. Considering a harmonic harvester with an input of u(s) and an output signal of Y(s), in which u(s) represents the difference between the power signal sent to the utility system 150 and the reference signal received from the power utility system 150, the transfer function may be written as:

$$\frac{Y(s)}{u(s)} = \frac{ks}{s^2 + 2\xi\omega s + \omega^2} \quad (1)$$

In this equation, k is a constant related to the voltage peak-to-peak associated with different harmonics, ξ is a constant related to the potential overshoot of the output signal and may be set at 0.9, and ω represents the angular frequency of the harmonic to be damped. In some embodiments, the value of k may be set at 70% of voltage peak-to-peak for the third harmonic and 30% of voltage peak-to-peak for the fifth harmonic. Other values may be used for k depending on the characteristics of the system.

The transfer function may be solved by letting Q(s)=ks and P(s)=s²+2ξωs+ω². Substituting these relationships into equation (1) yields:

$$\frac{Y(s)}{u(s)} = \frac{Q(s)}{P(s)} \quad (2)$$

Next, we define the following relationship: P(s) r(s)=u(s) Substituting r(s) into equation (2) provides the following:

$$Y(s)=Q(s)r(s) \quad (3)$$

Multiplying both sides by u(s) and dividing both sides by Y(s) yields:

$$u(s) = \frac{Q(s)u(s)r(s)}{Y(s)} \quad (4)$$

Substituting for P(s) results in:

$$u(s)=P(s)r(s)=(s^2+2\xi\omega s+\omega^2)r(s) \quad (5)$$

Performing an inverse transform to the time domain yields the following differential equation:

$$\ddot{r}(t)=-2\xi\omega\dot{r}(t)-\omega^2 r(t)+u(t) \quad (6)$$

Finally, the output Y(s) is given in the time domain, y(t), as:

$$y(t)=k\dot{r}(t) \quad (7)$$

Each of the variables k, ξ, and ω has constant values in each of the harmonic harvesting circuits. Accordingly, these values can be used in designing harmonic harvesting circuits.

Figure 3:
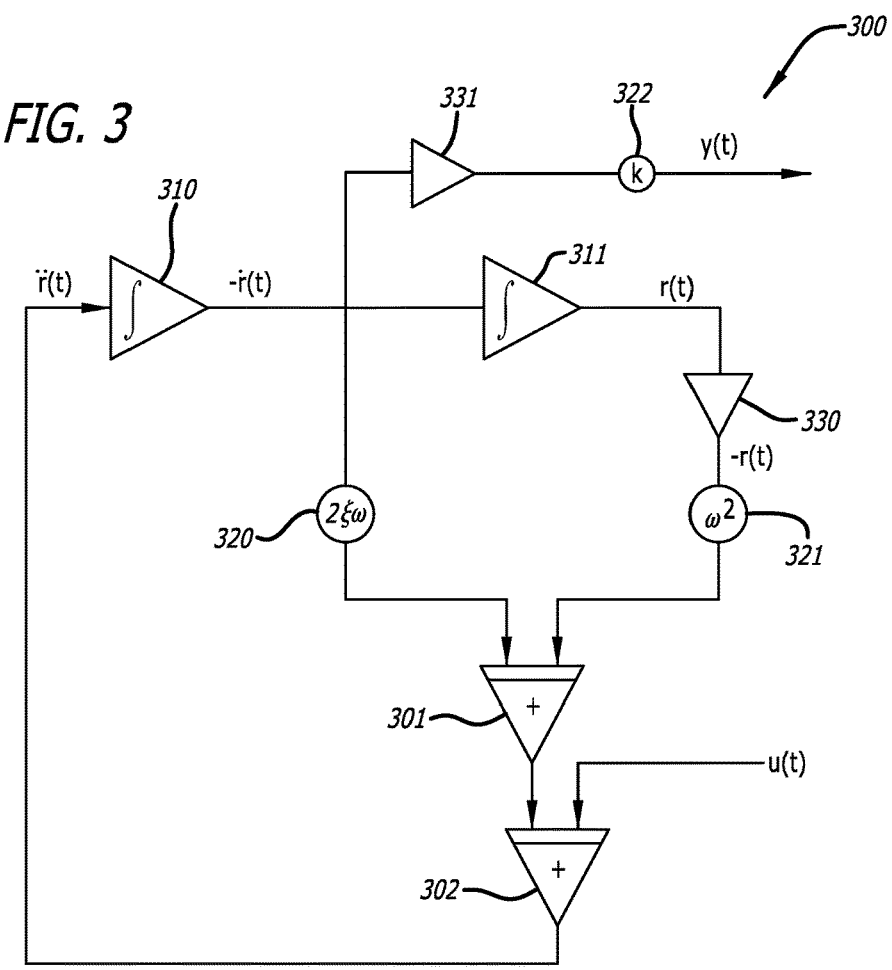
FIG. 3 provides a diagram illustrating an implementation of a harmonic harvester that operates in a low-current environment.

FIG. 3 provides a high level diagram of an exemplary harmonic harvester that operates in a low-current environment. A harmonic harvester 300 shown in FIG. 3 has an input of u(t) and an output of y(t), where u(t) represents the difference when the reference signal received from the utility is subtracted from the power output that is delivered to the utility. The term y(t) represents the output from the harmonic harvester 300 that is used to damp one of the harmonics present on the output from the inverter 120. As shown in FIG. 3, $\ddot{r}(t)$ may equal the sum provided by summing circuits 301 and 302. The summing circuit 301 may receive two inputs, one related to $\dot{r}(t)$ and the other related to r(t). The signal for $\dot{r}(t)$ may be produced by processing $\ddot{r}(t)$ through an integration circuit 310. The resulting signal, $\dot{r}(t)$, may then be multiplied by a circuit component 320. As illustrated in FIG. 3, the circuit component 320 may multiply signal $\dot{r}(t)$ by a constant represented by 2ξω. Thus, in a system in which the harmonic harvester 300 is configured to damp the third harmonic of a 60 Hz signal, the value of the constant 2ξω for the circuit component 320 may equal (2)(0.9)(60)(2π), or about 2036. Thus, in this configuration, one input to the summing circuit 301 may be −2036 $\dot{r}(t)$.

The second input to the summing circuit 301 may be related to r(t). In the embodiment shown in FIG. 3, the signal r(t) may be produced by processing the signal $\dot{r}(t)$ through an integration circuit 311. The signal r(t) may be further processed by an inverter 330, which results in the signal −r(t), and then multiplied by a constant represented by ω². In a system in which the harmonic harvester 300 is configured to damp the third harmonic of a 60 Hz signal, then the value of constant ω² equals about 1,279,025. Thus, in this configuration, a second input to the summing circuit 301 would be −1,279,025r(t). In this configuration, the output of the summing circuit 301 equals −(2036 $\dot{r}(t)$+1,279,025r(t)). In some implementations of the harmonic harvester 300, the output of the summing circuit 301 may be different. For example, the harmonic harvester 300 may be configured to damp the fifth harmonic of a 60 Hz system. In this situation, the output of the summing circuit 301 may equal −(3393 $\dot{r}(t)$+3,553,848r(t)).

The output of the summing circuit 301 serves as one input to a summing circuit 302. A second input for the summing circuit 302 is provided by the signal u(t), which in some implementations may represent the difference between the reference signal received from the utility system 150 and the power signal delivered to the utility system 150. As illustrated in FIG. 3, the output of the summing circuit 302 may be equal to −2ξω$\dot{r}(t)$−ω²r(t)+u(t). As shown in equation (6), this value also equals $\ddot{r}(t)$. As a result, the output of the summing circuit 302 is fed back into the integration circuit 310 to provide signals $\dot{r}(t)$ and r(t). In a situation in which harmonic harvester is used to damp the third harmonic of a 60 Hz signal, the output of the summing circuit 302 may equal −(3393 $\dot{r}(t)$+3,553,848r(t))+u(t).

Referring again to FIG. 3, the output of the harmonic harvester 300 equals k $\dot{r}(t)$ as shown in equation (7). In this situation, the harmonic harvester 300 may take the signal −$\dot{r}(t)$ and process it through an inverter 331 to provide the signal $\dot{r}(t)$. The harmonic harvester 300 then processes signal $\dot{r}(t)$ using a multiplier 322 to provide a constant gain of k. In some implementations, the value of k may be related to the harmonic to be damped. For example, the harmonic harvester 300, when configured to damp the third harmonic of a signal, may provide a value for k such that the output signal y(t) has a voltage equal to 70% of the voltage peak-to-peak of the power present on the utility system 150. In implementations in which the harmonic harvester 300 is configured to damp the fifth harmonic, the harmonic harvester 300 may use a value of k such that the voltage of the output signal y(t) equals 30% of the voltage peak-to-peak of the power present on the utility system 150. In some implementations, the value of k may be related to the expected or calculated voltage of a harmonic that may be present in a signal created by the inverter 120.

Figure 4:
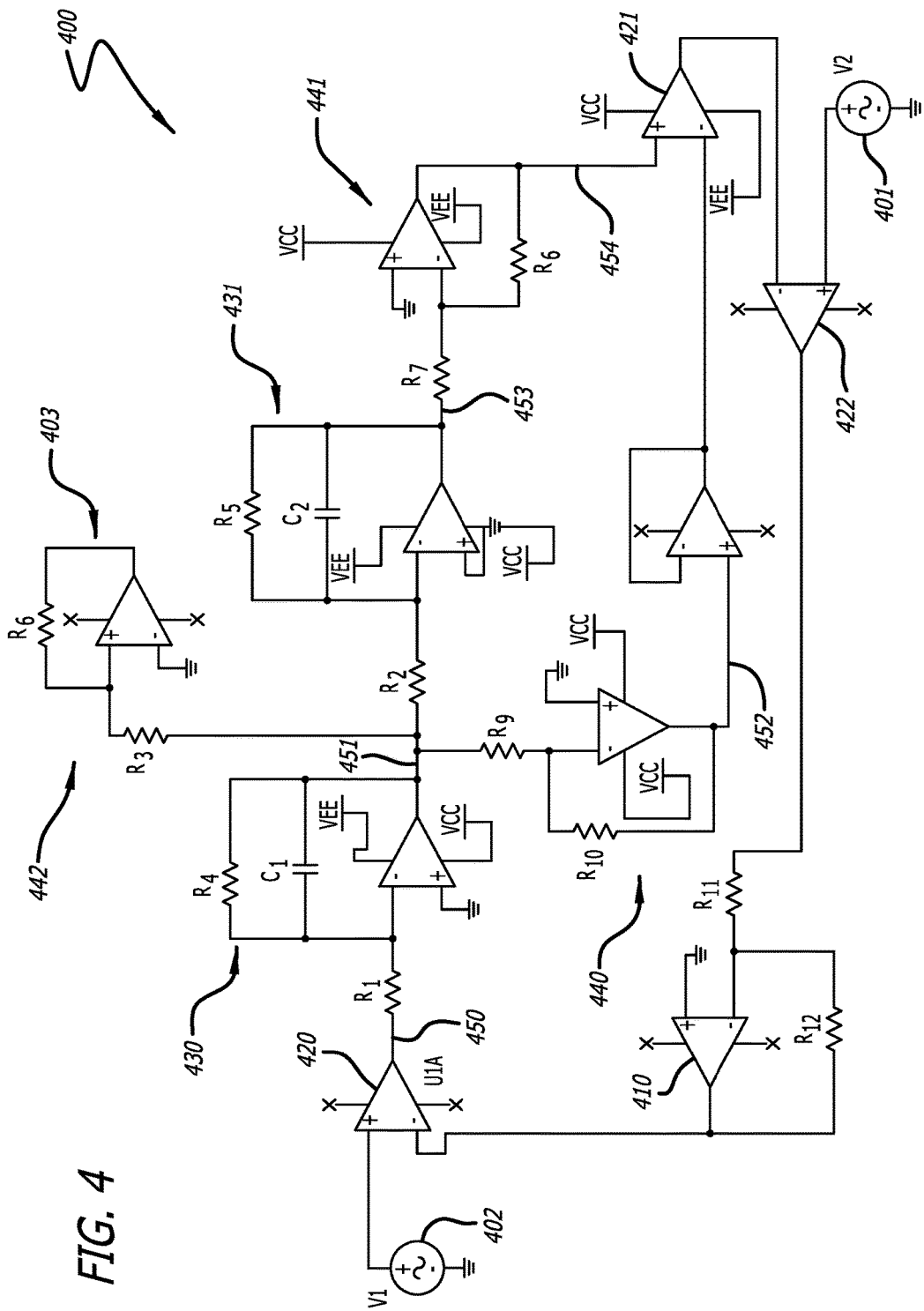
FIG. 4 provides a diagram illustrating an implementation in which potential locations and values for circuit components have identified in a harmonic harvester that operates in a low-current environment.

FIG. 4 illustrates a circuit diagram for an exemplary harmonic harvester that operates in a low-current environment. The inputs for a harmonic harvester 400 include a utility reference signal 401 and an inverter signal 402, which represents the signal delivered to the utility system 150. The output of the harmonic harvester 400 is provided as an output signal 403. In some implementations, the output signal 403 may be used to damp or potentially remove a harmonic present on a signal generated by the inverter 120. The harmonic harvester 400 may include an inverter 410; summing circuits 420, 421, and 422; integrating circuits 430 and 431; and amplifier circuits 440, 441, and 442. In some implementations, the values for one or more of the resistors and capacitors shown in FIG. 4 may be related to Equations (6) and (7). At least some of the values of the resistors and capacitors shown in the harmonic harvester 400 may be related to the value of the harmonic frequency that the harmonic harvester 400 seeks to damp or remove.

Let a signal 450 represent $\ddot{r}(t)$. This signal is input into the integrating circuit 430. The values for $R_4$ and $C_1$ in the integrating circuit 430 may be based on the harmonic frequency ($\omega_f$) to be damped by the harmonic harvester 400. In some implementations of the harmonic harvester 400, the relationship between $R_4$, $C_1$, and $\omega_f$ may be provided by the following equation:

$$\omega_f^2 = \frac{1}{R_4 C_1} \qquad (8)$$

In an implementation in which the harmonic harvester 400 is configured to damp the third harmonic of a 60 Hz signal, the value of $R_4$ may equal 17.70 and the value of $C_1$ may equal 50 µF to satisfy equation 8. The value for $R_1$ may be set to equal $R_4$. In some implementations, the values of $R_4$ and $C_1$ may vary according to equation (8). For example, in some implementations, the harmonic harvester 400 may be configured to damp or reduce a different harmonic frequency besides the third harmonic.

After processing signal $\ddot{r}(t)$, the integrating circuit 430 outputs a signal 451; accordingly, the signal 451 may represent $\dot{r}(t)$. As illustrated in FIG. 4, the signal 451 may be transmitted to three different components, the amplifying circuits 440 and 442, and the integrating circuit 431. In some implementations, the amplifying circuit 440 is configured to provide a gain to signal $\dot{r}(t)$ that equals $2\xi\omega_f$, where controls the amount of overshoot in output signal y(t) and $\omega_f$ equals the harmonic frequency to be damped. Accordingly, the output of the amplifying circuit 440 in such an implementation may equal $2\xi\omega_f \dot{r}(t)$. In some implementations, the value for $\xi$ is set to 0.9 to minimize any overshoot by output signal y(t). Thus, in an implementation in which the harmonic harvester 400 is configured to damp or reduce the third harmonic of a 60 Hz signal, the gain of the amplifying circuit 440 may equal $(2)(0.9)(2\pi)(3\times60)$, or a gain of about 2036. Thus, as illustrated in FIG. 4, the value of $R_9$ may be 100Ω and the value of $R_{10}$ may be 203.6 kΩ. In some implementations, the values for $R_9$ and $R_{10}$ may vary but in ways such that the gain of the amplifying circuit 440 remains at about 2036. A signal 452 output from the amplifying circuit 440 may equal the gain of the amplifying circuit 440 times the signal $\dot{r}(t)$. Thus, when the harmonic harvester 400 is configured to damp or remove the third harmonic from a 60 Hz signal, the output signal 452 may equal 2036$\dot{r}(t)$. After traveling through a buffer, the output signal 452 may be provided as an input to the summing circuit 421.

As illustrated in FIG. 4, the signal 451 may also be provided to the integrating circuit 431. The values for $R_5$ and $C_2$ in the integrating circuit 431 may be based on the harmonic frequency ($\omega_f$) to be damped by the harmonic harvester 400. In some implementations of the harmonic harvester 400, the relationship between $R_5$, $C_2$, and $\omega_f$ may be provided by the following equation:

$$\omega_f^2 = \frac{1}{R_5 C_2} \qquad (9)$$

In an implementation in which the harmonic harvester 400 is configured to damp the third harmonic of a 60 Hz signal, the value of $R_5$ may equal 17.70 and the value of $C_2$ may equal 50 µF to satisfy equation 9. The value for $R_2$ may be set to equal $R_5$. In some implementations, the values of $R_5$ and $C_2$ may vary according to equation (9). For example, in some implementations, the harmonic harvester 400 may be configured to damp or reduce a different harmonic frequency besides the third harmonic, which may result in different values for $R_5$ and $C_2$.

After processing signal $\dot{r}(t)$, the integrating circuit 431 outputs a signal 453; accordingly, the signal 453 may represent r(t). As shown in FIG. 4, the amplifying circuit 441 may provide a gain to the signal 453. In some implementations of the harmonic harvester 400, the gain provided by the amplifying circuit 441 may equal $\omega^2$ such that the output of the amplifying circuit 441 may equal $\omega^2 r(t)$. Thus, in an implementation in which the harmonic harvester 400 is configured to damp or reduce the third harmonic of a 60 Hz signal, the value of $\omega^2$, and the gain of the amplifying circuit 441, may equal $(2\pi (3\times60))^2$, or about 1,279,025. Accordingly, in the implementation shown in FIG. 4, the value for $R_7$ may equal 100Ω and the value of $R_6$ may equal about 355MΩ. As a result, a signal 454 output from the amplifying circuit 441 may equal (1.279M)(r(t)). As illustrated in FIG. 4, some implementations of the harmonic harvester 400 may provide the signal 454 as a second input to the summing circuit 421.

As illustrated in FIG. 4, the signal 451 may be input into the amplifying circuit 442. The harmonic harvester 400 may use the output of the amplifying circuit 442 as the output of the system, y(t). In some implementations, the harmonic harvester 400 may base the gain of the amplifying circuit 442 on the harmonic frequency the harmonic harvester 400 is configured to damp. For example, in implementations in which the harmonic harvester 400 is configured to damp the third harmonic of a 60 Hz signal, harmonic harvester may produce an output signal, y(t), with a voltage that equals 70% of the voltage peak-to-peak of the 60 Hz signal. In some implementations in which the harmonic harvester 400 is configured to damp the fifth harmonic of a 60 Hz signal, the harmonic harvester 400 may produce an output signal, y(t), with a voltage that equals 30% of the voltage peak-to-peak of the 60 Hz signal. In some implementations, multiple harmonic harvesters 400 may be configured to damp different harmonic frequencies of a signal. In this implementation, the outputs from each of the harmonic harvesters may be added together and applied to the signal. As illustrated in FIG. 4, the gain of the amplifying circuit 442 may be set to 33 by setting $R_3$ equal to 10 kΩ and $R_6$ equal to 330 kΩ. As illustrated in FIG. 4, the amplifying circuit 442 may also be configured to invert the output signal y(t). The gain of the amplifying circuit 442 may be modified based on the voltage of the input signal 451 and the desired voltage for the output signal y(t).

As illustrated in FIG. 4, the summing circuit 421 may accept two inputs. As illustrated in FIG. 4, the summing circuit 421 may accept the signal 452 from the amplifying circuit 440 as an input. The summing circuit 421 may also accept the signal 454 from the amplifying circuit 441 as an input. Adding these two signal together may result in an output signal for the summing circuit 421 that equals $2\xi\omega_f \dot{r}(t)+\omega^2 r(t)$.

In the implementation shown in FIG. 4, the output of the summing circuit 421 may be supplied as an input to the summing circuit 422. The summing circuit 422 may also accept as an input the reference signal ($V_{Ref}(t)$) from the utility system 150. Thus, as illustrated in FIG. 4, the signal output from the summing circuit 422 may equal $2\xi\omega_f \dot{r}(t)+\omega^2 r(t)+V_{Ref}(t)$. This signal is then inverted by the inverter 410 and provided as an input to the summing circuit 420. In some implementations, the values for $R_{11}$ and $R_{12}$ may be equal. The summing circuit 420 may accept as another input the signal, $V_{Inv}(t)$, from the inverter 120 in which one or more harmonics have been damped or removed. In some implementations, this same signal, $V_{Inv}(t)$, may have been output to the power system 150. Accordingly, in such an implementation, the output of the summing circuit 420 may equal $-2\xi\omega_f \dot{r}(t)-\omega^2 r(t)+V_{Inv}(t)-V_{Ref}(t)$. Noting that $u(t)=V_{Inv}(t)-V_{Ref}(t)$, as shown in FIG. 1, then the output signal 450 of the summing circuit 420 may be written as $-2\xi\omega_f \dot{r}(t)-\omega^2 r(t)+u(t)$, the value according to equation (6) of $\ddot{r}(t)$.

The following tables provide exemplary values for at least some of the resistors and capacitors in the harmonic harvester 400.

| Device | 3$^{rd}$ Harmonic | 5$^{th}$ Harmonic |
|---|---|---|
| $R_1$ | 17.7 Ω | 10.6 Ω |
| $R_2$ | 17.7 Ω | 10.6 Ω |
| $R_4$ | 17.7 Ω | 10.6 Ω |
| $R_5$ | 17.7 Ω | 10.6 Ω |
| $R_9$ | 100 Ω | 100 Ω |
| $R_{10}$ | 127.9 MΩ | 355.3 MΩ |
| $C_1$ | 50 μF | 50 μF |
| $C_2$ | 50 μF | 50 μF |

In some implementations, these values may be varied in accordance with the previous discussion of the harmonic harvester 400.

It will also be appreciated that in some embodiments the functionality provided by the routines discussed above may be provided in alternative ways, such as being split among more routines or consolidated into fewer routines. Similarly, in some embodiments illustrated routines may provide more or less functionality than is described, such as when other illustrated routines instead lack or include such functionality respectively, or when the amount of functionality that is provided is altered. In addition, while various operations may be illustrated as being performed in a particular manner (e.g., in serial or in parallel, synchronously or asynchronously, etc.) and/or in a particular order, those skilled in the art will appreciate that in other embodiments the operations may be performed in other orders and in other manners. Those skilled in the art will also appreciate that the data structures discussed above may be structured in different manners, such as by having a single data structure split into multiple data structures or by having multiple data structures consolidated into a single data structure. Similarly, in some embodiments illustrated data structures may store more or less information than is described, such as when other illustrated data structures instead lack or include such information respectively, or when the amount or types of information that is stored is altered.

In addition, the figures discussed herein are for illustrative purposes only. They are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

From the foregoing it will be appreciated that, although specific embodiments have been described herein for purposes of illustration, various modifications may be made without deviating from the spirit and scope of the invention. Accordingly, the invention is not limited except as by the appended claims and the elements recited therein. In addition, while certain aspects of the invention are presented below in certain claim forms, the inventors contemplate the various aspects of the invention in any available claim form. For example, while only some aspects of the invention may currently be recited as being embodied in a computer-readable medium, other aspects may likewise be so embodied.

What is claimed is:

1. A system for reducing one or more harmonics in a first signal, the first signal having a first current, the system comprising:
   a step-down converter that uses the first signal to generate a second signal, wherein the second signal has a second current that is less than the first current;
   a harmonic harvester system that includes one or more harmonic harvesters, wherein each harmonic harvester in operation uses one or more op amps to produce a damping signal that at least reduces one harmonic in the first signal, wherein the harmonic harvester system combines each damping signal produced by each harmonic harvester into a third signal having a third current, and wherein at least one harmonic harvester in operation satisfies a second-order differential equation with a transfer function given by:

$$\frac{Y(s)}{u(s)} = \frac{ks}{s^2 + 2\xi\omega s + \omega^2}$$

wherein ω represents a harmonic to be reduced by the at least one harmonic harvester, wherein a value for k is chosen based on a voltage of the harmonic to be reduced, and wherein a value for ξ is chosen to substantially prevent overshoot of the damping signal produced by the at least one harmonic harvester; and
   a step-up converter that uses the third signal to generate a fourth signal, wherein the fourth signal has a fourth current that is greater than the third current.

2. The system of claim 1, wherein the harmonics reduced by at least one of the damping signals includes at least a third harmonic.

3. The system of claim 1, wherein the harmonics reduced by at least one of the damping signals includes at least a fifth harmonic.

4. The system of claim 1, further comprising a battery and an inverter, wherein the inverter generates the first signal.

5. The system of claim 1, further comprising a component that combines the first signal and the fourth signal to result in a clean power signal, the clean power signal being delivered to a power utility system.

6. The system of claim 5, further comprising a phase lock loop that synchronizes the fourth signal to a reference signal received from the power utility system.

7. A system for reducing one or more harmonics in a high current signal, the system comprising:
- a step-down converter that uses the high current input signal to generate a low current input signal, wherein a current of the low current input signal is less than a current of the high current input signal;
- a harmonic harvester system that includes one or more harmonic harvesters, wherein each harmonic harvester in operation uses one or more op amps to produce a damping signal that at least reduces one harmonic in the high current input signal, wherein the harmonic harvester system combines each damping signal produced by each harmonic harvester into a low current filtering signal, and wherein at least one harmonic harvester in operation satisfies a second-order differential equation with a transfer function given by:

$$\frac{Y(s)}{u(s)} = \frac{ks}{s^2 + 2\xi\omega s + \omega^2}$$

wherein ω represents a harmonic to be reduced by the at least one harmonic harvester, wherein a value for k is chosen based on a voltage of the harmonic to be reduced, and wherein a value for ξ is chosen to substantially prevent overshoot of the low current damping signal produced by the at least one harmonic harvester; and
- a step-up converter that uses the low current filtering signal to generate a high current filtering signal, wherein a current of the low current filtering signal is less than a current of the high current filtering signal.

8. The system of claim 7, wherein the harmonics reduced by at least one of the damping signals includes at least a third harmonic.

9. The system of claim 7, wherein the harmonics reduced by at least one of the damping signals includes at least a fifth harmonic.

10. The system of claim 7, further comprising a battery and an inverter, wherein the inverter generates the high current input signal.

11. The system of claim 7, further comprising a component that combines the input high current signal with the high current filtering signal to produce a clean high current signal, the clean high current signal being delivered to a power utility system.

12. The system of claim 11, further comprising a phase lock loop that synchronizes the high current filtering signal to a reference signal received from the power utility system.

13. A method for reducing one or more harmonics in a first signal, the first signal having a first current, the method comprising:
- stepping-down the first signal to generate a second signal, wherein the second signal has a second current that is less than the first current;
- providing a harmonic harvester system that includes one or more harmonic harvesters, wherein each harmonic harvester in operation uses one or more op amps;
- producing a damping signal from each harmonic harvester, using the one or more op amps of each harmonic harvester, that at least reduces one harmonic in the first signal, wherein at least one harmonic harvester in operation satisfies a second-order differential equation with a transfer function given by:

$$\frac{Y(s)}{u(s)} = \frac{ks}{s^2 + 2\xi\omega s + \omega^2}$$

wherein ω represents a harmonic to be reduced by the at least one harmonic harvester, wherein a value for k is chosen based on a voltage of the harmonic to be reduced, and wherein a value for ξ is chosen to substantially prevent overshoot of the damping signal produced by the at least one harmonic harvester;
- combining, using the harmonic harvester system, each damping signal produced by each harmonic harvester into a third signal having a third current;
- stepping-up the third signal to generate a fourth signal, wherein the fourth signal has a fourth current that is greater than the third current; and
- damping the one or more harmonics in the first signal by combining the first signal and the fourth signal.

14. The method of claim 13, wherein the harmonics reduced by at least one of the damping signals includes at least a third harmonic.

15. The method of claim 13, wherein the harmonics reduced by at least one of the damping signals includes at least a fifth harmonic.

16. The method of claim 13, further comprising generating the first signal using a battery and an inverter.

17. The method of claim 13, further comprising synchronizing the fourth signal to a reference signal received from the power utility system.

* * * * *